US008864379B2

(12) United States Patent
Hays et al.

(10) Patent No.: US 8,864,379 B2
(45) Date of Patent: Oct. 21, 2014

(54) DRAWER MOUNTING SYSTEM

(75) Inventors: Kristina M. Hays, Rochester, MN (US); John J. Loparco, Poughkeepsie, NY (US); Steven C. McIntosh, Kingston, NY (US); Stephen P. Mroz, Rochester, MN (US); Kevin R. Qualters, LaGrangeville, NY (US); Scott A. Shurson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 944 days.

(21) Appl. No.: 12/943,921

(22) Filed: Nov. 10, 2010

(65) Prior Publication Data

US 2012/0114272 A1   May 10, 2012

(51) Int. Cl.
*A47B 88/00*   (2006.01)
*H05K 7/14*    (2006.01)

(52) U.S. Cl.
CPC ................................ *H05K 7/1489* (2013.01)
USPC ................... 384/19; 312/334.12; 312/334.21

(58) Field of Classification Search
USPC ............ 384/18–22, 50, 58; 312/223.1–223.3, 312/334.7, 334.12, 334.13, 334.18, 334, 19, 312/334.44, 334.45, 334.46, 330.1, 334.4, 312/334.5
See application file for complete search history.

(56) References Cited

U.S. PATENT DOCUMENTS

| | | | |
|---|---|---|---|
| 2,780,510 A | 2/1957 | Cole, Jr. .................... 312/334.13 |
| 3,056,641 A | 10/1962 | Parmet ...................... 312/334.37 |
| 3,093,429 A | 6/1963 | Christen et al. ............... 312/331 |
| 3,130,732 A | 4/1964 | McClellan ..................... 220/547 |
| 3,574,421 A * | 4/1971 | Stein et al. ....................... 384/19 |
| 4,119,377 A | 10/1978 | Barber et al. ............. 312/334.19 |
| 4,288,137 A | 9/1981 | MacDonald ............. 312/334.45 |
| 4,639,145 A * | 1/1987 | Lautenschlager ............... 384/19 |
| 5,460,441 A | 10/1995 | Hastings et al. .............. 312/298 |
| 5,876,103 A | 3/1999 | Domenig .................... 312/334.4 |
| 6,126,255 A * | 10/2000 | Yang ....................... 312/334.46 |
| 6,230,903 B1 * | 5/2001 | Abbott ............................ 211/26 |
| 6,442,030 B1 | 8/2002 | Mammoser et al. .......... 361/727 |
| 6,883,884 B2 * | 4/2005 | Chen et al. ..................... 312/333 |
| 7,086,708 B2 * | 8/2006 | Tseng et al. .............. 312/334.44 |
| 2005/0285492 A1 * | 12/2005 | Hu et al. .................... 312/334.4 |
| 2010/0244643 A1 * | 9/2010 | Chiang .................... 312/334.44 |

* cited by examiner

*Primary Examiner* — Phillip A Johnson
(74) *Attorney, Agent, or Firm* — Margaret A. McNamara; Ido Tuchman

(57) ABSTRACT

A system to carry a drawer may include a fixed-length rail to be fastened to a server rack. The system may also include a roller fastened to the fixed-length rail on one side of the roller so that the roller spins freely. The system may further include a channel carried by a drawer, and the channel is sized to permit the roller to traverse a portion of the channel.

20 Claims, 5 Drawing Sheets

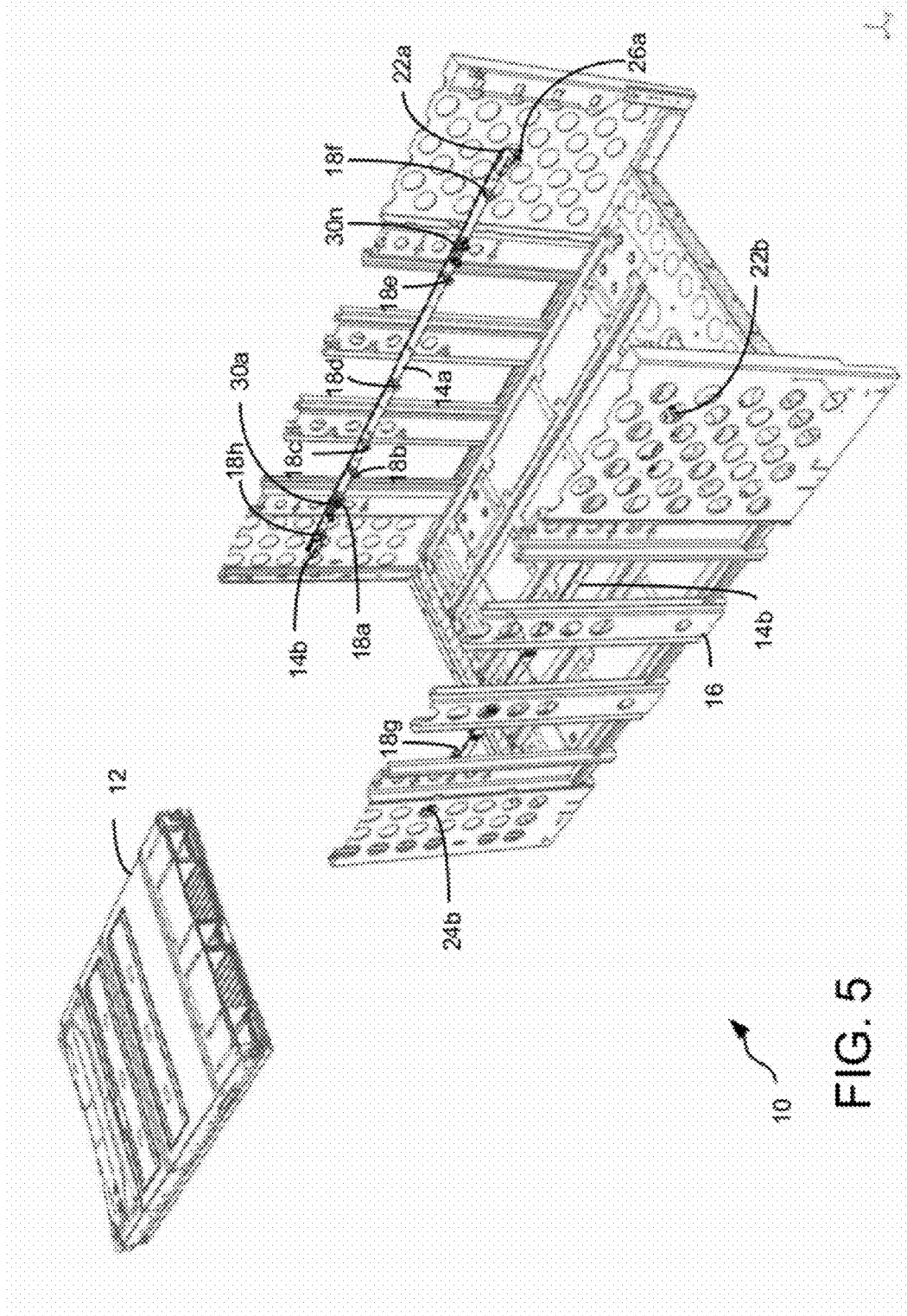

DRAWER MOUNTING SYSTEM

STATEMENT REGARDING FEDERALLY SPONSORED RESEARCH OR DEVELOPMENT

This invention was made with Government support under Contract No. HR0011-07-9-0002, awarded by the Defense Advanced Research Projects Agency (DARPA). The Government has certain rights in this invention.

BACKGROUND

1. Field of the Invention

The invention relates to the field of computer systems, and, more particularly, to a drawer system for computer hardware.

2. Description of Background

Generally, to maintain concurrent maintenance capabilities as well as robust mechanical alignment of computing devices within high end server products, precision telescopic slides are typically used to mount and deploy large processor and storage drawer entities. The limitations of such systems are numerous.

SUMMARY

According to one embodiment of the invention, a system to carry a server drawer may include a fixed-length rail to be fastened to a server rack. The system may also include a roller fastened to the fixed-length rail on one side of the roller so that the roller spins freely. The system may further include a channel carried by a server drawer, and the channel is sized to permit the roller to traverse a portion of the channel.

The system may additionally include a first retention block carried by one end of the fixed-length rail and/or a second retention block carried by another end of the fixed-length rail. The first retention block and the second retention block may limit the travel of the roller along the channel.

The first retention block may include a fastener used to secure the server drawer in a given position. The roller may comprise a cam follower.

The channel may be substantially U-shaped. The roller may be positioned away from the rail by a spacer.

The rail may be fastened to the server rack by a captive screw block. The rail may be positioned for fastening to the server rack by alignment pins. The roller may comprise a plurality of rollers in spaced relation along the rail.

In an embodiment, the system may include a fixed-length rail fastened to a rack. The system may further include a cam follower roller fastened to the fixed-length rail on one side of the cam follower roller so that the cam follower roller spins freely. The system may additionally include a substantially U-shaped channel carried by a drawer, the U-shaped channel sized to permit the cam follower roller to traverse a portion of the channel.

In an embodiment, the system may include a fixed-length rail fastened to a rack. The system may further include a roller fastened to the fixed-length rail on one side of the roller so that the roller spins freely. The system may additionally include a substantially U-shaped channel carried by a drawer, the U-shaped channel sized to permit the roller to traverse a portion of the U-shaped channel. The system may also include a first retention block carried by one end of the fixed-length rail to limit the travel of the roller along the U-shaped channel in the direction towards the first retention block, the first retention block including a fastener used to secure the drawer in a given position. The system may further include a second retention block carried by the other end of the fixed-length rail to limit the travel of the roller along the U-shaped channel in the direction towards the second retention block.

BRIEF DESCRIPTION OF THE DRAWINGS

FIG. 5 is a top-side view of the drawer before being mated with the rails and rack of FIG. 1.

DETAILED DESCRIPTION

Figure 1:
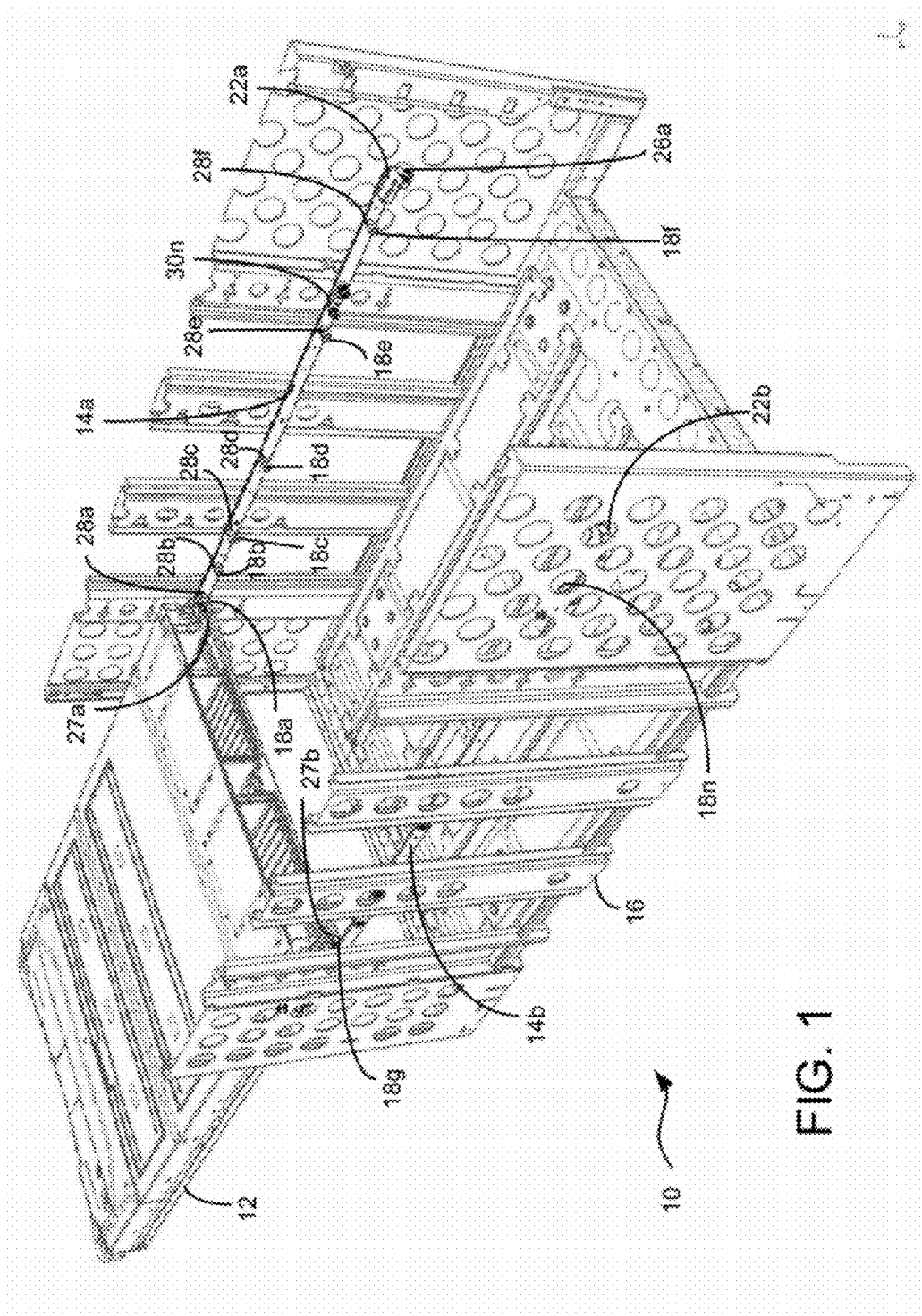
FIG. 1 is a top-side view of a server drawer slide system in accordance with the invention.
Figure 2:
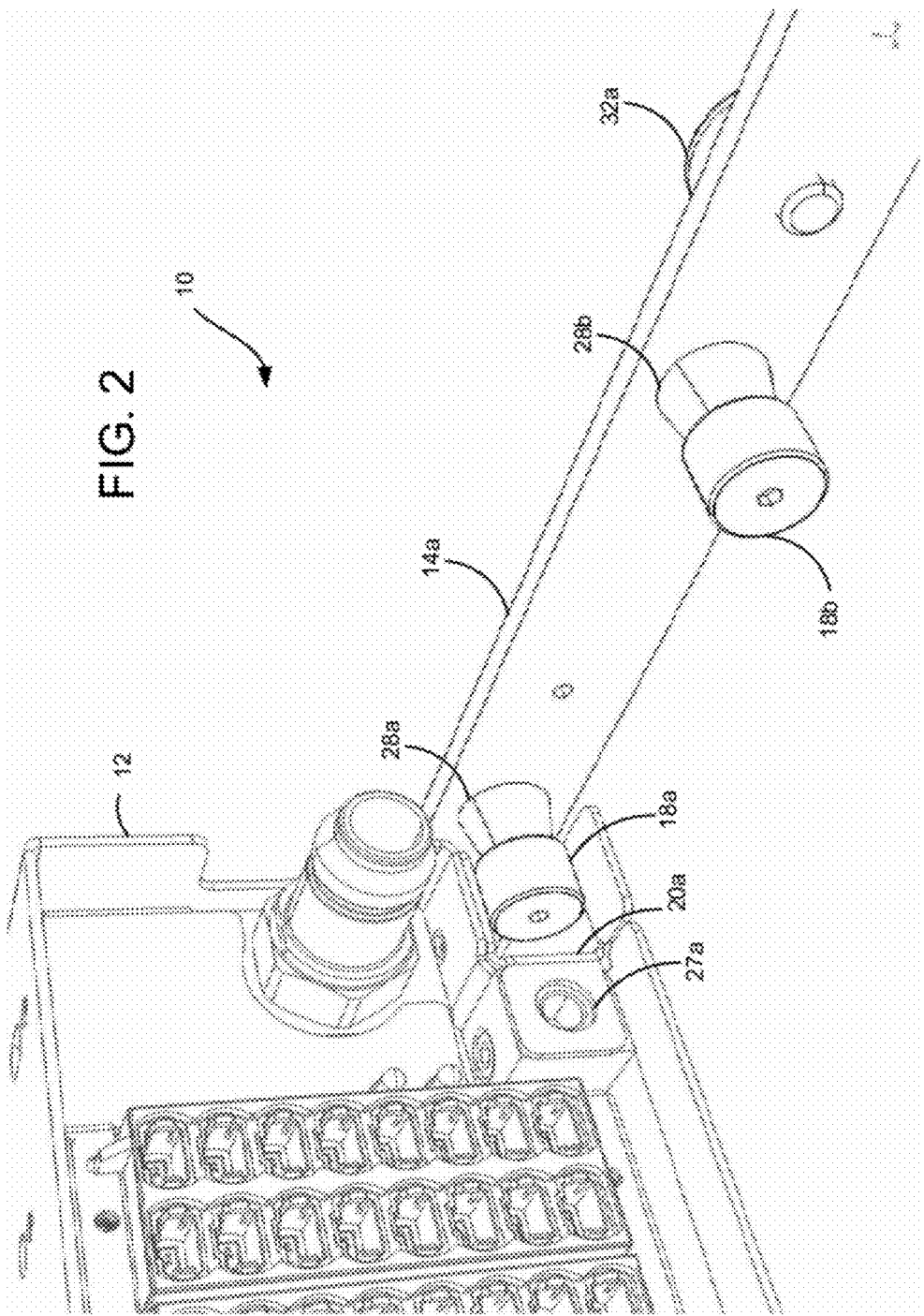
FIG. 2 is a close-up view of the roller/channel interface of the drawer slide system of FIG. 1.
Figure 3:
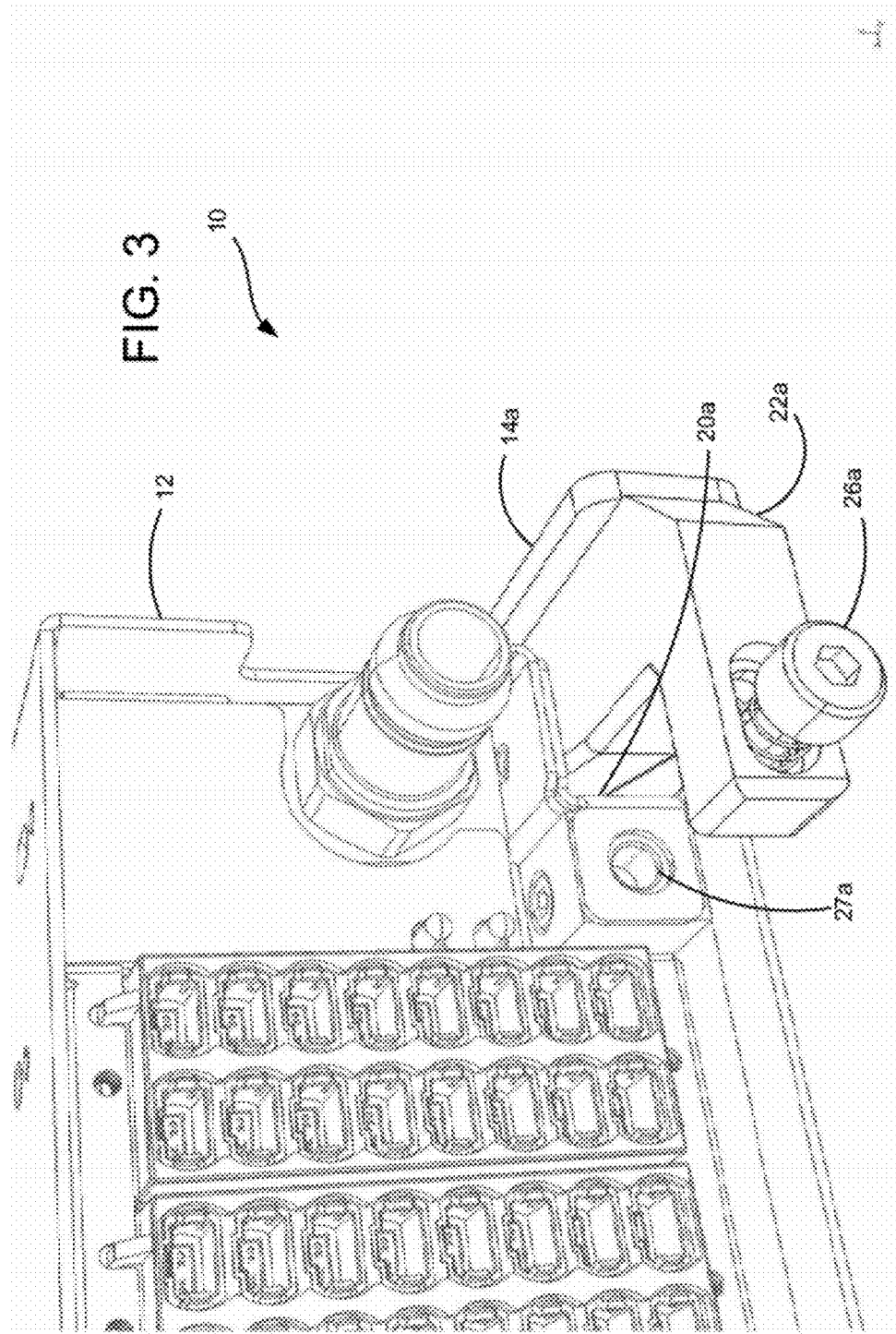
FIG. 3 is a close-up view of the first retention block/drawer interface of the drawer slide system of FIG. 1.

The invention will now be described more fully hereinafter with reference to the accompanying drawings, in which preferred embodiments of the invention are shown. Like numbers refer to like elements throughout, like numbers with letter suffixes are used to identify similar parts in a single embodiment, and letter suffix lower case n is a variable that indicates an unlimited number of similar elements.

With reference now to FIGS. 1-5, a system 10 to carry a server drawer 12 is initially described. According to one embodiment of the invention, the system 10 includes a fixed-length rail 14a and/or 14b to be fastened to a server rack 16. The system 10 also includes a roller 18a-18n fastened to the fixed-length rail 14a and/or 14b on one side of the roller so that the roller spins freely. The system 10 further includes a channel 20a and/or 20b carried by the drawer 12, and the channel is sized to permit the roller 18a-18n to traverse a portion of the channel (see FIG. 2).

In an embodiment, the system 10 additionally includes a first retention block 22a and/or 22b carried by one end of the respective fixed-length rail 14a and/or 14b, and/or a second retention block 24a and/or 24b carried by another end of the respective fixed-length rail. The first retention block 22a and/or 22b and the second retention block 24a and/or 24b limit the travel of the roller 18a-18n along the channel 20a and/or 20b.

In an embodiment, the first retention block 22a and/or 22b includes a fastener 26a and/or 26b used to secure the drawer 12 in a given position (see FIG. 3) to a respective catch 27a and/or 27b. In another embodiment, the roller 18a-18n comprises a cam follower roller and/or the like.

In an embodiment, the channel 20a and/or 20b are substantially U-shaped. In another embodiment, the channel 20a and/or 20b has an alternate shape such as L-shaped and/or the like.

Figure 4:
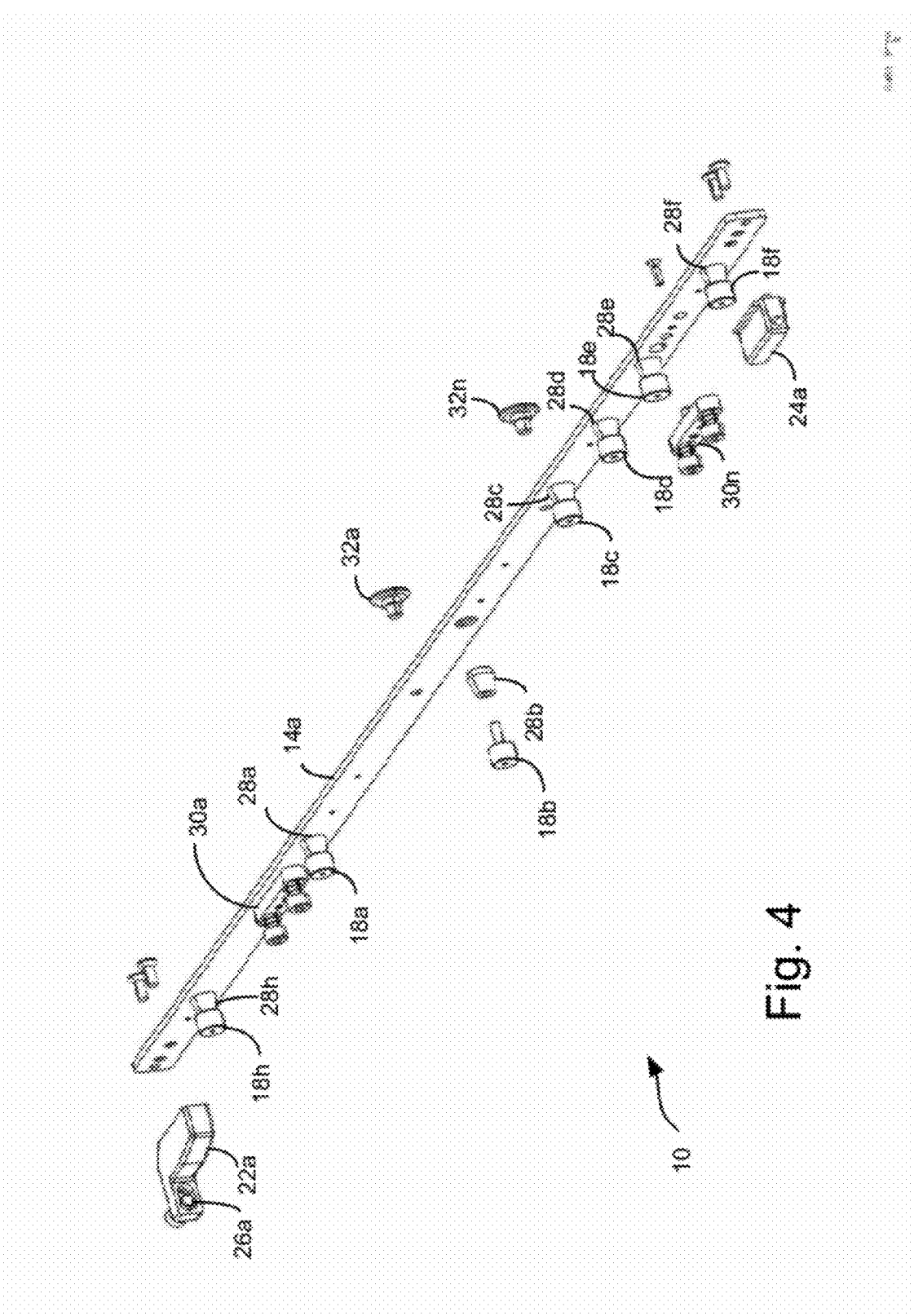
FIG. 4 is a top-side view of the rail subassembly of the system of FIG. 1.

In an embodiment, the roller 18a-18n is positioned away from the rail 14a and/or 14b by a respective spacer 28a-28n (see FIG. 4). In another embodiment, the spacer 28a-28n is a welded standoff.

In an embodiment, the rail 14a and/or 14b is fastened to the rack 12 by a captive screw block 30a-30n. In another embodiment, the rail 14a and/or 14b is positioned for fastening to the rack 12 by alignment pins 32a-32n. In another embodiment, the roller 18a-18n comprises a plurality of rollers in spaced relation along the rail 14a and/or 14b as will be appreciated by those of skill in the art.

In view of the foregoing, the system 10 is a superior slide for a drawer 12 over the conventional drawer slides currently available. For example, due to the ever increasing weights and packaging densities of computing entities, the form factor of conventional, commercially available ball bearing slides is often too large and costly to be accommodated efficiently. In addition, commercially available slides require precision alignment to engage and disengage the slide members for drawer removal from the cabinet, e.g. rack. Due to the increasing width of computer drawers, precise visual alignment of typical slides is becoming more difficult and prone to defects with the currently available technology.

In contrast, rather than utilizing interlocking telescoping members with ball bearings, the system 10 uses a stationary rail 14a and/or 14b, e.g. bar, with cam follower rollers 18a-18n and corresponding integrated U-channel 20a and/or 20b within the drawer 12. This approach provides two major advantages over the prior art. First is the minimal form factor of system 10. While commercially available ball bearing slides require a minimum height of approximately 3 inches or more to support loads of up to 500 pounds in moderate use applications, system 10 uses approximately 1 inch of height, thus maximizing packaging space.

And secondly, system 10 provides improved alignment during mating of the rail 14a and/or 14b subsystem with the respective channel 20a and/or 20b. For instance, commercial telescopic slides typically require disengagement of the secondary member to completely remove the drawer from the cabinet or rack. To replace the drawer, these members must be accurately aligned to allow engagement and to prevent damage to small ball bearings and bearing races. In contrast, system 10 uses the coarse alignment of a larger, robust roller 18a-18n into an open U-channel 20a and/or 20b, thereby improving the visual alignment characteristics and thus minimizing the risk for defects and damage during the mating of drawer 12 with rack 16.

In an embodiment, system 10 comprises a stationary rail 14a and/or 14b on which a series of cam follower rollers 18a-18n are attached. Also attached to the rail 14a and/or 14b are a series of captive fasteners 30a-30n and alignment pins 32a-32n used to attach the rail to the rack 16, as well as first retention block 22a and/or 22b and second retention block 24a and/or 24b used to retain the drawer 12 to the rail 14a and/or 14b. Corresponding U-channels 20a and/or 20b are integrated onto the sides of the drawer 12 to engage with the rollers 18a-18n. The drawer 12 is then joined with the rail 14a and/or 14b by inserting the drawer 12 into the rack 16, engaging the rollers 18a-18n into the U-channels 20a and/or 20b, and retaining the drawer via the captive retention screws 26a and/or 26b. The rail 14a and/or 14b assembly can be further enhanced by integrating additional features such as cable management hardware.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A server rack system comprising:
   a fixed-length rail to be fastened to a server rack;
   a roller fastened to the fixed-length rail on one side of the roller so that the roller spins freely;
   a server drawer including a server drawer frame, a top surface and a bottom surface; and
   a channel positioned inside a cubiod area bounded by the top surface and the bottom surface of the server drawer and defined by the server drawer frame, the channel sized to permit the roller to traverse a portion of the channel.

2. The system of claim 1 further comprising at least one of a first retention block carried by one end of the fixed-length rail, and a second retention block carried by another end of the fixed-length rail, the first retention block and the second retention block to limit the travel of the roller along the channel.

3. The system of claim 2 wherein the first retention block includes a fastener used to secure the server drawer in a given position.

4. The system of claim 1 wherein the roller comprises a cam follower.

5. The system of claim 1 wherein the channel is substantially U-shaped.

6. The system of claim 1 wherein the roller is positioned away from the rail by a spacer.

7. The system of claim 1 wherein the rail is fastened to the server rack by a captive screw block.

8. The system of claim 1 wherein the rail is positioned for fastening to the server rack by alignment pins.

9. The system of claim 1 wherein the roller comprises a plurality of rollers in spaced relation along the rail.

10. A server rack system comprising:
    a fixed-length rail fastened to a server rack;
    a cam follower roller fastened to the fixed-length rail on one side of the cam follower roller so that the cam follower roller spins freely;
    a server drawer including a server drawer frame, a top surface and a bottom surface; and
    a substantially U-shaped channel positioned inside a cubiod area bounded by the top surface and the bottom surface of the server drawer and defined by the server drawer frame, the U-shaped channel sized to permit the cam follower roller to traverse a portion of the channel.

11. The system of claim 10 further comprising at least one of a first retention block carried by one end of the fixed-length rail, and a second retention block carried by another end of the fixed-length rail, the first retention block and the second retention block to limit the travel of the cam follower roller along the U-shaped channel.

12. The system of claim 11 wherein the first retention block includes a fastener used to secure the server drawer in a given position.

13. The system of claim 10 wherein the cam follower roller is positioned away from the rail by a spacer.

14. The system of claim 10 wherein the rail is fastened to the server rack by a captive screw block.

15. The system of claim 10 wherein the rail is positioned for fastening to the server rack by alignment pins.

16. The system of claim 10 wherein the cam follower roller comprises a plurality of cam follower rollers in spaced relation along the rail.

17. A server rack system comprising:
 a fixed-length rail fastened to a server rack;
 a roller fastened to the fixed-length rail on one side of the roller so that the roller spins freely;
 a server drawer including a server drawer frame, a top surface and a bottom surface; and
 a substantially U-shaped positioned inside a cubiod area bounded by the top surface and the bottom surface of the server drawer and defined by the server drawer frame, the U-shaped channel sized to permit the roller to traverse a portion of the U-shaped channel;
 a first retention block carried by one end of the fixed-length rail to limit the travel of the roller along the U-shaped channel in the direction towards the first retention block, the first retention block including a fastener used to secure the server drawer in a given position; and
 a second retention block carried by the other end of the fixed-length rail to limit the travel of the roller along the U-shaped channel in the direction towards the second retention block.

18. The system of claim 17 wherein the roller comprises a cam follower.

19. The system of claim 17 wherein the roller is positioned away from the rail by a spacer.

20. The system of claim 17 wherein the roller comprises a plurality of rollers in spaced relation along the rail.

\* \* \* \* \*